United States Patent [19]

Wang et al.

[11] Patent Number: 5,705,441
[45] Date of Patent: Jan. 6, 1998

[54] ION IMPLANT SILICON NITRIDE MASK FOR A SILICIDE FREE CONTACT REGION IN A SELF ALIGNED SILICIDE PROCESS

[75] Inventors: Jau-Jey Wang; Yuan-Lung Liu, both of Hsin-Chu, Taiwan

[73] Assignee: Taiwan Semiconductor Manufacturing Company, Ltd., Hsin-Chu, Taiwan

[21] Appl. No.: 618,177

[22] Filed: Mar. 19, 1996

[51] Int. Cl.⁶ .................................. H01L 21/28
[52] U.S. Cl. .................. 438/384; 438/586; 438/655; 438/659
[58] Field of Search ........................ 438/238, 423, 438/528, 586, 645, 655, 659, 664, 683

[56] References Cited

U.S. PATENT DOCUMENTS

| | | | |
|---|---|---|---|
| 4,406,051 | 9/1983 | Iizuka | 438/238 |
| 4,897,368 | 1/1990 | Kobushi et al. | 438/659 |
| 5,438,015 | 8/1995 | Lur | 437/62 |
| 5,547,881 | 8/1996 | Wang et al. | 437/24 |

*Primary Examiner*—John Niebling
*Assistant Examiner*—Thomas G. Bilodeau
*Attorney, Agent, or Firm*—George O. Saile; Stephen B. Ackerman; Larry J. Prescott

[57] ABSTRACT

A method is described for forming a high contact resistance region within the drain region or source region of an insulated gate field effect transistor as part of a high resistance resistor for electrostatic discharge protection of the field effect transistor. The silicide free contact region is formed as part of a self aligned silicide, or salicide, contact process. Nitrogen ion implantation followed by annealing is used to form a silicon nitride mask at the silicide free contact region. The mask prevents the formation of low contact resistance metal silicide at the silicide free contact region during the salicide process. Low resistance contacts to the gate electrode, source, and drain are formed using metal silicide.

14 Claims, 4 Drawing Sheets

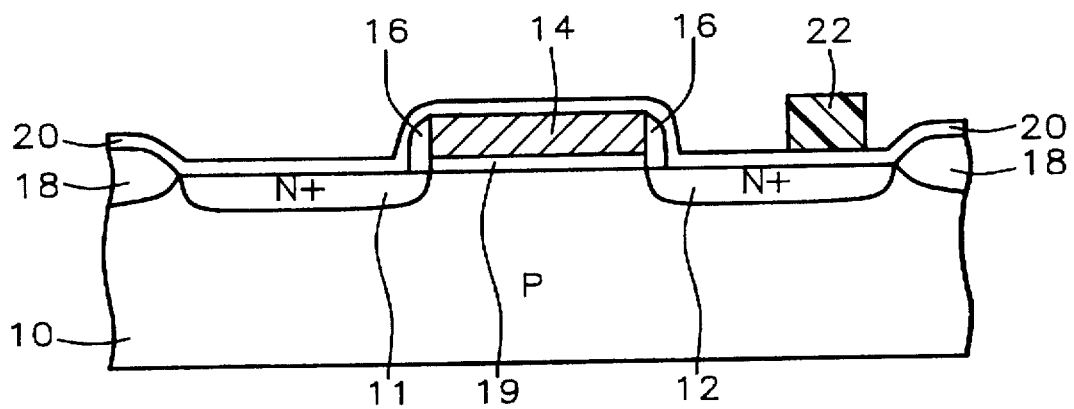
FIG. 1A – Prior Art
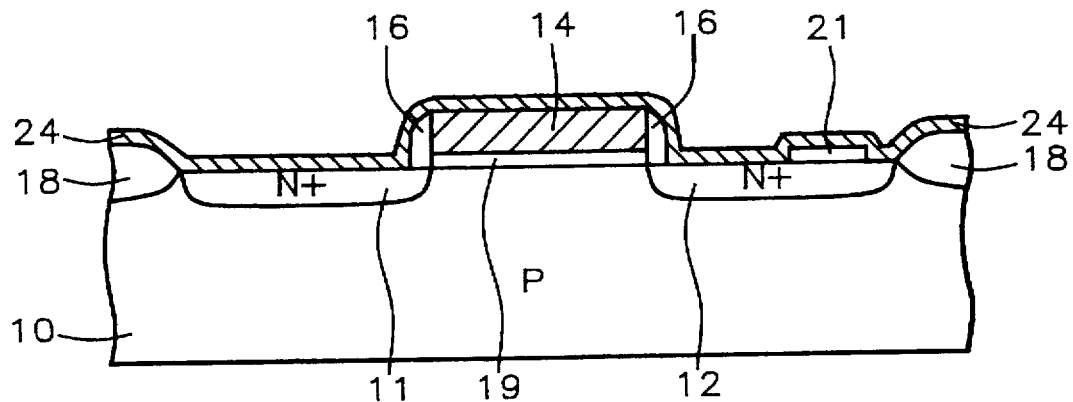
FIG. 1B – Prior Art
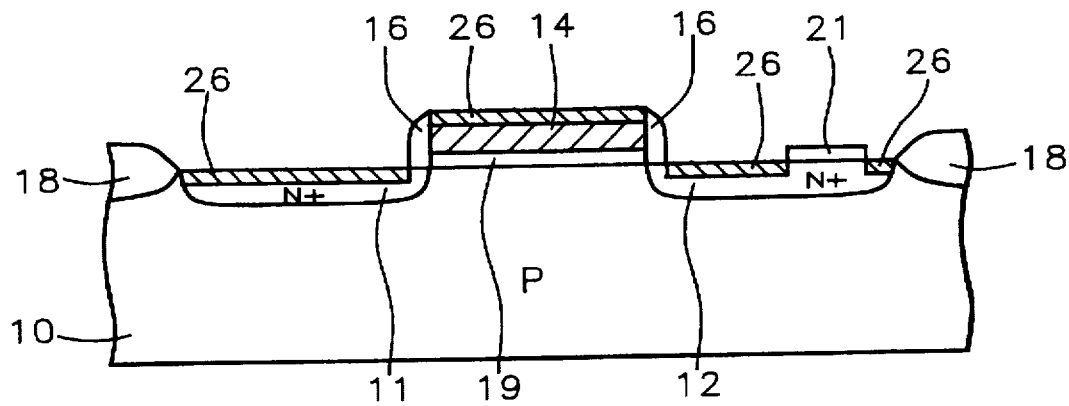
FIG. 1C – Prior Art

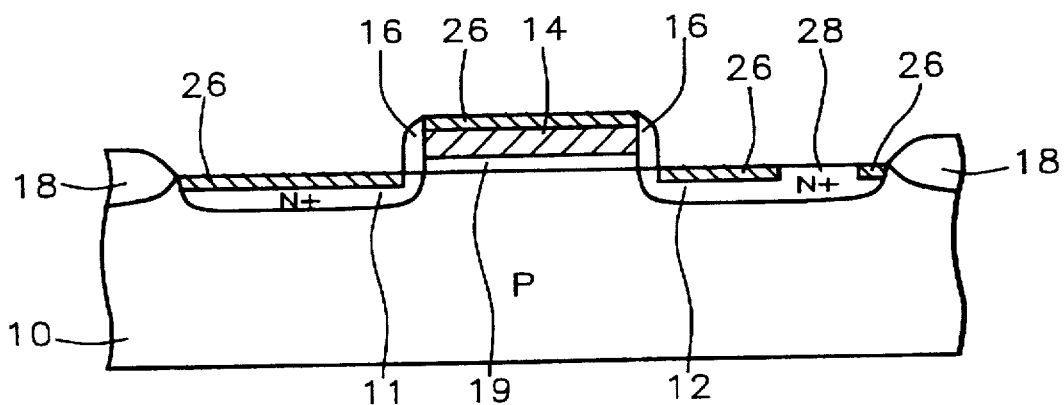
FIG. 1D – Prior Art
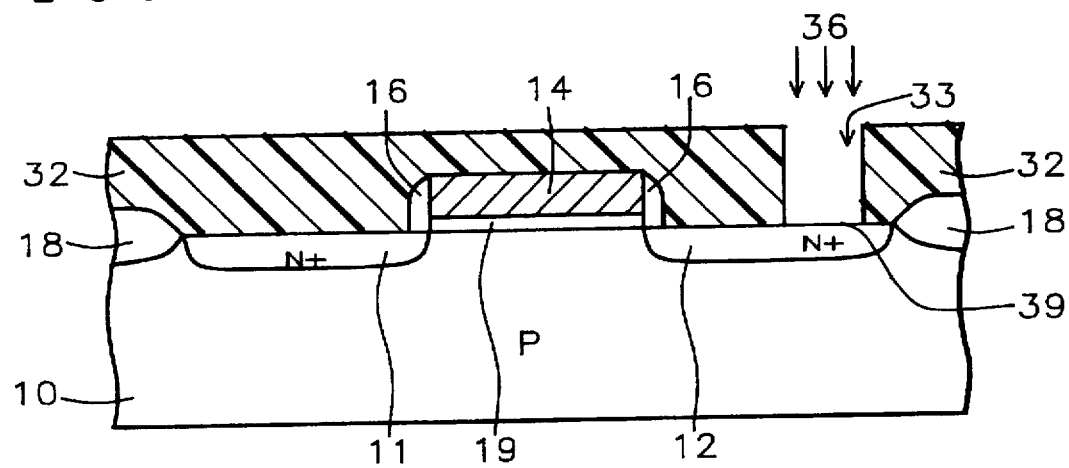
FIG. 2
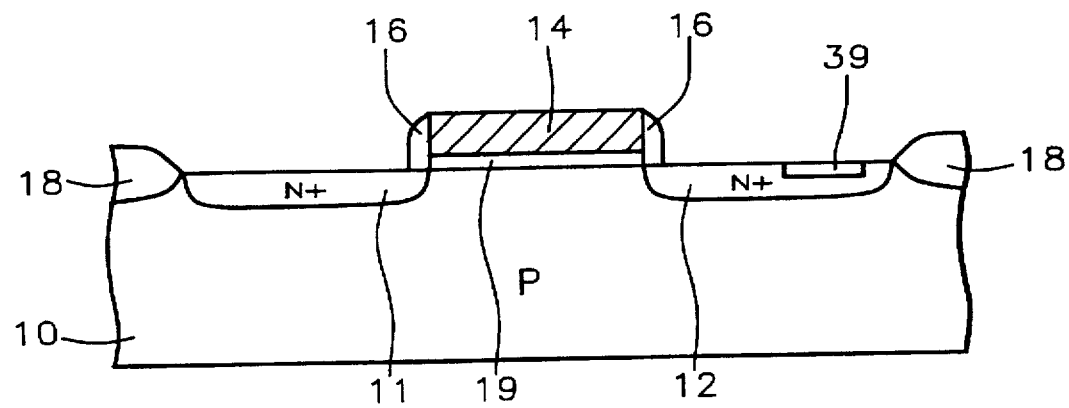
FIG. 3

ION IMPLANT SILICON NITRIDE MASK FOR A SILICIDE FREE CONTACT REGION IN A SELF ALIGNED SILICIDE PROCESS

RELATED PATENT APPLICATION

Ser. No. 08/612,620, filed Mar. 6, 1996, now U.S. Pat. No. 5,547,811, entitled A NOVEL METHOD OF FORMING A RESISTOR FOR ESD PROTECTION IN A SELF ALIGNED SILICIDE PROCESS, assigned to the same assignee.

BACKGROUND OF THE INVENTION

(1) Field of the Invention

The invention relates to the prevention of silicide formation at a contact to non salicide devices, such as a high resistance resistors, when other contacts are formed using a self aligned silicide, or salicide, process. More specifically the invention relates to using a silicon nitride mask to prevent the formation of low resistance titanium silicide at the contact to the high resistance resistor or other non silicide contact device.

(2) Description of the Related Art

One important method of protection from damage due to electrostatic discharge, or ESD, in insulated gate field effect transistors is to use high resistance resistors to prevent high currents due to ESD. The formation of these high resistance resistors requires a contact region to either the source or drain regions of the field effect transistors which does not have a low resistance silicide. There are process problems which must be overcome in the formation of these contact regions when the low resistance contacts are formed using self aligned silicide methods. In the method taught by this invention a silicon nitride mask is formed at the high resistance resistor contact using nitrogen ion implantation followed by annealing. The silicon nitride mask prevents the formation of titanium silicide an the high resistance resistor contact.

The formation of silicon nitride by ion implantation of nitrogen into a silicon substrate followed by heat is described in U.S. Pat. No. 5,438,015 to Lur. The method described by Lur uses ion implantation to form a silicon nitride layer below the surface of the silicon substrate for device isolation. The silicon nitride layer is later etched away to leave an air insulator for isolation between devices.

SUMMARY OF THE INVENTION

Damage from electrostatic discharge, ESD, to insulated gate field effect transistors has long been a problem. In using these devices in integrated circuits, electrostatic voltages large enough to damage gate oxides can easily be generated by human operator or mechanical handling of integrated circuits.

In order to protect insulated gate field effect transistors from damage due to ESD, methods have been devised to prevent the electrostatic voltages from building up to levels which can damage the transistors. In one such method a high resistance resistor is introduced to prevent sensitive device elements from the high, even though of very short duration, currents of electrostatic discharge. The formation of a low resistance silicide contact must be avoided at the contact to this high resistance resistor.

FIGS. 1A–1D show a conventional method for forming a silicide free contact to the source or drain of a metal oxide semiconductor field effect transistor formed using a self aligned silicide, or salicide, process. FIG. 1A shows a semiconductor substrate 10 having a source region 11, drain region 12, field oxide isolation regions 18, gate oxide 19, a polysilicon gate electrode 14 having sidewalls, and oxide spacers 16 formed on the sidewalls of the gate electrode. An oxide layer 20 is then formed on the silicon substrate covering the source 11, drain 12, gate electrode 14, and oxide spacers 16. A photoresist pattern 22 is then formed over the oxide layer 20 directly over the region where the silicide free contact will be formed.

As shown in FIG. 1B, the oxide layer is then etched away leaving an oxide pattern 21 only over the region where the silicide free contact will be formed. A titanium layer 24 is then deposited over the silicon substrate and annealed thereby forming titanium silicide 26 over the gate electrode 14, the source region 11, and that part of the drain region 12 not covered by the oxide pattern 21. As shown in FIG. 1C, that part of the titanium layer which has not been converted to titanium silicide is then etched away. Finally, as shown in FIG. 1D, the oxide pattern is etched away and a silicide free contact region 28, having no titanium silicide, is formed in the drain region. The titanium silicide 26 forms low resistance contact regions at the gate electrode 14, the source region 11, and the drain region 12. This example has shown the silicide free contact region formed at the drain region, however the source and drain regions are interchangeable and the example could have shown the silicide free contact region in the source region.

A serious limitation of the conventional method of forming a silicide free contact region just described comes from the requirement to etch away the oxide layer 20 in order to form the oxide pattern 21 over the region where the silicide free contact will be formed, see FIGS. 1A and 1C. In etching the oxide layer 20, see FIG. 1A, part of the oxide spacer 16 will also be etched and this will increase the probability of gate to source/drain leakage.

It the objective of this invention to provide a method of forming a silicide free contact region in either the source region or the drain region of an insulated gate field effect transistor using metal silicide for low resistance contacts which will avoid oxide spacer loss and will use fewer process steps than the conventional method.

This objective is achieved by using a nitrogen ion beam to form a silicon nitride layer at the silicide free contact region. A metal layer is then formed over the silicon substrate covering the source region, the drain region, the silicon nitride layer at the silicide free contact region, the gate electrode, and the oxide spacers. The substrate and metal layer are then annealed and metal silicide is formed at the gate electrode, the source region, and the drain region except for the silicon nitride layer at the silicide free contact region. The unreacted part of the metal layer is then etched away leaving a silicon nitride layer at the silicide free contact region within either the source region or the drain region, and metal silicide for low resistance contacts to the source region, the drain region, and the gate electrode.

BRIEF DESCRIPTION OF THE DRAWINGS

FIG. 1A shows a cross section view of a silicon integrated circuit substrate after formation of the oxide layer and the photoresist pattern for the formation of the conventional silicide free contact.

FIG. 1B shows a cross section view of a silicon integrated circuit substrate after formation of the oxide pattern and the deposition of the titanium layer for the conventional method of forming a silicide free contact region.

FIG. 1C shows a cross section view of a silicon integrated circuit substrate after the titanium layer has been annealed for the conventional method of forming a silicide free contact region.

FIG. 1D shows a cross section view of a silicon integrated circuit substrate after the unreacted titanium and the oxide pattern for the conventional method of forming a silicide free contact region.

FIG. 2 shows a cross section view of a silicon integrated circuit substrate after formation of a photoresist layer having a contact hole formed over the region where the silicide free contact region will be formed and a nitrogen ion beam bombarding the silicon substrate through the contact hole in the photoresist.

FIG. 3 shows a cross section view of a silicon integrated circuit substrate after the silicon substrate has been bombarded by the nitrogen ion beam, the photoresist has been removed, and the silicon substrate has been annealed to form the silicon nitride layer.

DESCRIPTION OF THE PREFERRED EMBODIMENTS

Figure 4:
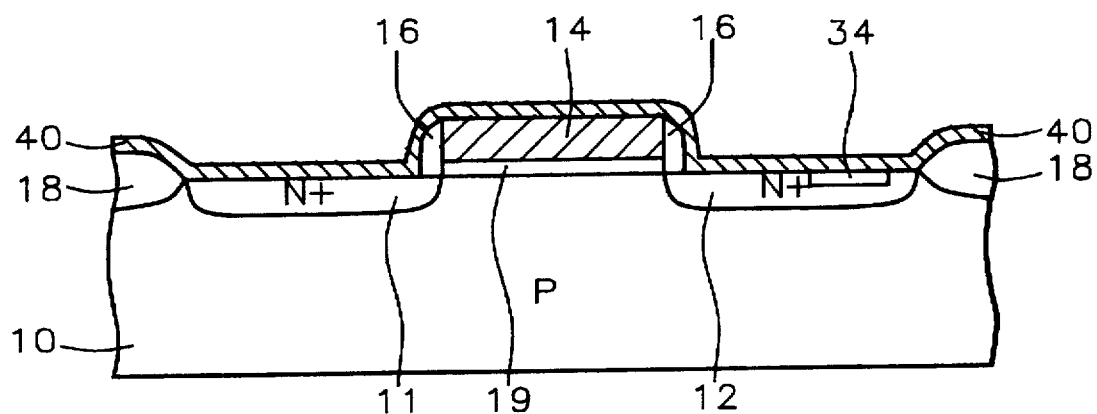
FIG. 4 shows a cross section view of a silicon integrated circuit substrate after the titanium has been formed.

Refer now to FIGS. 2–7, there is shown an embodiment for the method of forming a silicide free contact region of this invention. FIG. 2 shows a source region 11, a drain region 12, and field oxide regions 18 formed in a silicon integrated circuit substrate 10. There is a silicide free contact region 39 within the drain region 12 where the silicide free contact will be formed. This embodiment shows the silicide free contact region 39 within the drain region 12, however the silicide free contact region 39 could be in the source region 11. The silicon substrate 10 will have a number of such devices only one of which is shown. A gate oxide region 19 and a gate electrode 14 having sidewalls are formed on the silicon substrate 10. Oxide spacers 16 are formed on the sidewalls of the gate electrode 14. A photoresist layer 32 having a contact hole 33 is formed over the silicon substrate covering the source region 11, the drain region, the silicide free contact region 39, the gate electrode 14 and the spacers 16. A contact hole 33 is formed in the photoresist layer 32 directly over the silicide free contact region 39.

A beam of nitrogen ions 36 having an energy of between about 30 keV and 80 keV and a beam density of between about $5 \times 10^{15}$ and $1 \times 10^{16}$ ions/cm$^2$ is directed at the silicide free contact region 39 through the contact hole 33 in the photoresist layer 32 thereby implanting nitrogen ions in the silicon substrate at the silicide free contact region. FIGS. 2–7 show cross section views of an N channel metal oxide semiconductor field effect transistor, however the method will work equally well for P channel metal oxide semiconductor field effect transistors.

Next, as shown in FIG. 3, the photoresist layer 32 is removed and the substrate is annealed using a first anneal having a temperature of between about 650° C. and 710° C. for between about 20 and 60 seconds. During the first anneal the implanted nitrogen ions react with the silicon thereby forming a layer of silicon nitride 34 at the silicon free contact region. Next, as shown in FIG. 4, a layer of metal 40, in this example titanium, having a thickness of between about 400 and 800 Angstroms is formed over the silicon substrate covering the source region 11, the drain region 12, the gate electrode 14, the oxide spacers 16, and the silicon nitride 34 at the silicide free contact region.

Figure 5:
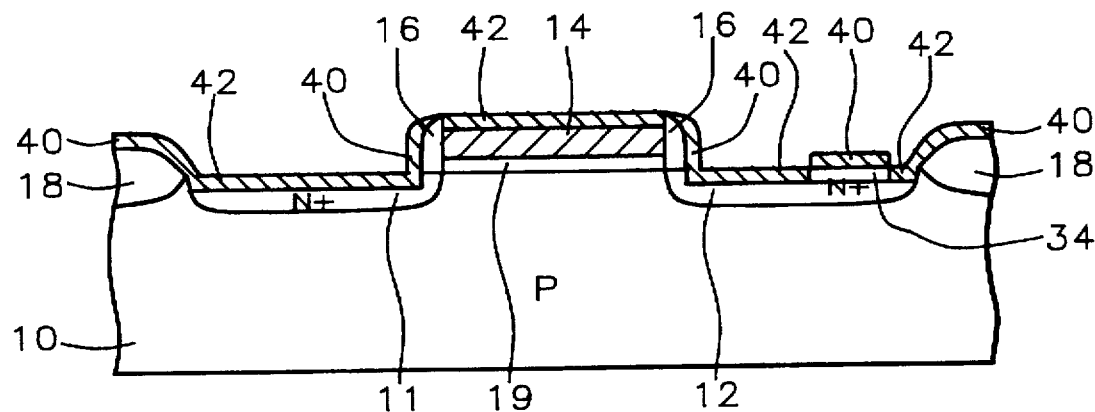
FIG. 5 shows a cross section view of a silicon integrated circuit substrate after the titanium has been annealed forming titanium silicide.

Next, as shown in FIG. 5, the silicon substrate and the metal layer is annealed using a second anneal having a temperature of between about 800° C. and 900° C. for between about 20 and 60 seconds. During the second anneal those parts of the metal layer 40, in this example titanium, which are in contact with silicon react with the silicon to form metal silicide 42, in this example titanium silicide. In this manner the titanium silicide forms self aligned low resistance contacts to the source region 11, the drain region 12, and the gate electrode 14 without the use of additional masks or masking steps. The titanium silicide will not form at the oxide regions, the oxide spacers 16, the field oxide regions 18, or at the layer of silicon nitride 34 at the silicide free contact region.

Figure 6:
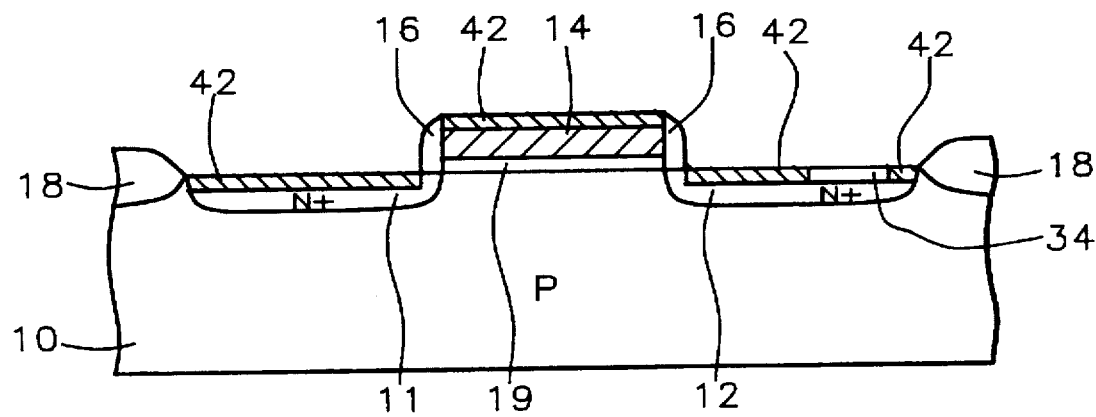
FIG. 6 shows a cross section view of a silicon integrated circuit substrate after the unreacted titanium have been etched away.

As shown in FIG. 6, that part of the titanium layer which has not been converted to titanium silicide is etched away using a 1:1:5 solution of $NH_4OH+H_2O_2+H_2O$. Thus titanium silicide 42 forms low resistance contacts to the source region 11, the drain region 12, and the gate electrode 14. The silicon nitride layer 34 prevents the formation of titanium silicide at the silicide free contact region.

Figure 7:
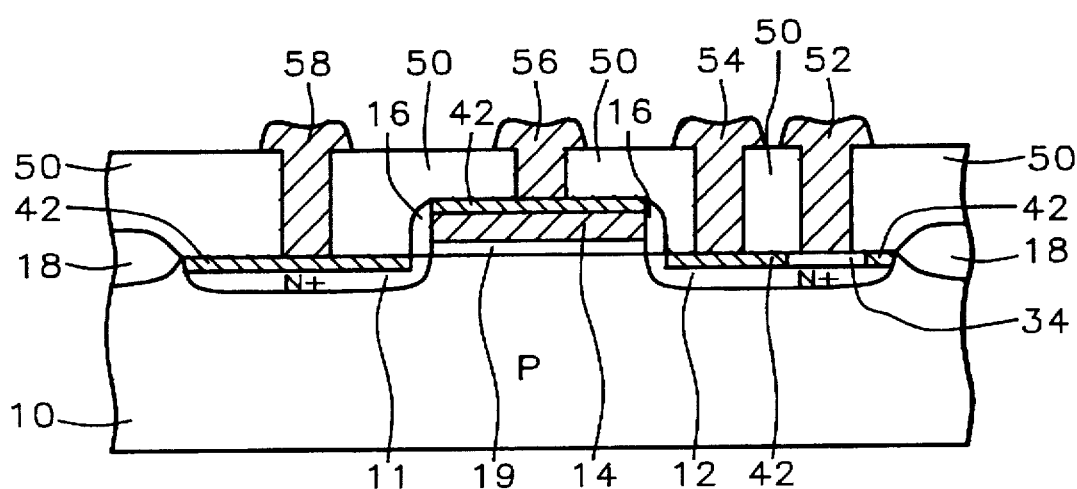
FIG. 7 shows a cross section view of a silicon integrated circuit substrate after the passivation layer and contact holes in the passivation layer have been formed.

Next, as shown in FIG. 7, a passivation layer 50, such as borophosphosilicate glass or the like, is formed on the silicon substrate and contact holes to the gate electrode 14, source 11, drain 12, and silicon nitride layer 34 are formed in the passivation layer. The contact holes in the passivation layer are filled with a conductor to form a gate contact 56, a source contact 58, a drain contact 54, and a contact 52 to the silicon free contact region. The contact 52 to the silicide free contact region contacts the silicon nitride layer 34 for contact to an electrostatic discharge protection resistor or other device using a silicide free contacts.

This embodiment has described the silicide free contact region formed in the drain region of the field effect transistor. The silicide free contact region could equally well have been formed in the source region of the field effect transistor. FIGS. 2–7 show an N channel field effect transistor. The embodiment works equally well in a P channel field effect transistor.

While the invention has been particularly shown and described with reference to the preferred embodiments thereof, it will be understood by those skilled in the art that various changes in form and details may be made without departing from the spirit and scope of the invention.

What is claimed is:

1. A method of forming a silicide free contact region, comprising the steps of:
   providing a silicon substrate with a number of devices formed therein wherein each device comprises a source region, a drain region, a silicide free contact region within said drain region, and a channel region;
   providing field oxide regions formed in said silicon substrate;
   providing gate oxide patterns formed on said silicon substrate over said channel regions;
   providing polysilicon gate electrodes having sidewalls formed on said gate oxide patterns;
   providing oxide spacers formed on said sidewalls of said polysilicon gate electrodes;

forming a photoresist layer on said silicon substrate covering said polysilicon gate electrodes, said oxide spacers, said source regions, said drain regions, and said silicide free contact regions;

forming contact hole openings in said photoresist layer directly over said silicide free contact regions whereby said contact hole openings expose said silicide free contact regions;

implanting nitrogen ions into said silicide free contact regions by means of a beam of nitrogen ions using said photoresist layer with contact hole openings as a mask;

removing said photoresist layer after implanting said nitrogen ions into said silicide free contact regions;

annealing said silicon substrate using a first anneal after implanting said nitrogen ions and removing said photoresist layer thereby forming a layer of silicon nitride over said silicide free contact regions;

forming a metal layer on said silicon substrate covering said polysilicon gate electrodes, said oxide spacers, said source regions, said drain regions, and said silicon nitride layer after annealing said silicon substrate using said first anneal;

annealing said silicon substrate and said metal layer using a second anneal thereby forming metal silicide over said polysilicon gate electrodes, said source regions, and said drain regions except said layer of silicon nitride;

etching away those parts of said metal layer not changed to metal silicide, after annealing said silicon substrate and said metal layer using said second anneal;

forming a passivation layer over said silicon substrate after etching away those parts of said metal layer not changed to metal silicide;

forming contact holes in said passivation layer thereby exposing part of said layer of silicon nitride and parts of said metal silicide formed over said polysilicon gate electrodes, said source regions, and said drain regions; and filling said contact holes in said passivation layer with conducting material.

2. The method of claim 1 wherein said metal layer is titanium having a thickness of between about 400 and 800 Angstroms and said metal silicide is titanium silicide.

3. The method of claim 1 wherein said beam of nitrogen ions has an energy of between about 30 keV and 80 keV and a beam density of between about $5 \times 10^{15}$ and $1 \times 10^{16}$ ions/$cm^2$.

4. The method of claim 1 wherein said first anneal is at a temperature of between about 650° C. and 710° C. for between about 20 and 60 seconds.

5. The method of claim 1 wherein said second anneal is at a temperature of between about 800° C. and 900° C. for between about 20 and 60 seconds.

6. The method of claim 1 wherein said etching away those parts of said metal layer not changed to metal silicide uses a 1:1:5 solution of $NH_4OH+H_2O_2+H_2O$.

7. The method of claim 1 wherein said etching away those parts of said metal layer not changed to metal silicide does not require a mask.

8. A method of forming a silicide free contact, comprising the steps of:

providing a silicon substrate with a number of devices formed therein wherein each device comprises a source region, a drain region, a silicide free contact region within said source region, and a channel region;

providing field oxide regions formed in said silicon substrate;

providing gate oxide patterns formed on said silicon substrate over said channel regions;

providing polysilicon gate electrodes having sidewalls formed on said gate oxide patterns;

providing oxide spacers formed on said sidewalls of said polysilicon gate electrodes;

forming a photoresist layer on said silicon substrate covering said polysilicon gate electrodes, said oxide spacers, said drain regions, said source regions, and said silicide free contact regions;

forming contact hole openings in said photoresist layer directly over said silicide free contact regions whereby said contact hole openings expose said silicide free contact regions;

implanting nitrogen ions into said silicide free contact regions by means of a beam of nitrogen ions using said photoresist layer with contact hole openings as a mask;

removing said photoresist layer after implanting said nitrogen ions into said silicide free contact regions;

annealing said silicon substrate using a first anneal after implanting said nitrogen ions and removing said photoresist layer thereby forming a layer of silicon nitride over said silicide free contact regions;

forming a titanium layer on said silicon substrate covering said polysilicon gate electrodes, said oxide spacers, said source regions, said drain regions, and said silicon nitride layer after annealing said silicon substrate using said first anneal;

annealing said silicon substrate and said titanium layer using a second anneal thereby forming titanium silicide over said polysilicon gate electrodes, said drain regions, and said source regions except said layer of silicon nitride;

etching away those parts of said titanium layer not changed to titanium silicide, after annealing said silicon substrate and said titanium layer using said second anneal;

forming a passivation layer over said silicon substrate after etching away those parts of said titanium layer not changed to titanium silicide;

forming contact holes in said passivation layer thereby exposing part of said layer of silicon nitride and parts of said titanium silicide formed over said polysilicon gate electrodes, said source regions, and said drain regions; and filling said contact holes in said passivation layer with conducting material.

9. The method of claim 8 wherein said titanium layer has a thickness of between about 400 and 800 Angstroms.

10. The method of claim 8 wherein said beam of nitrogen ions has an energy of between about 30 keV and 80 keV and a beam density of between about $5 \times 10^{15}$ and $1 \times 10^{16}$ ions/$cm^2$.

11. The method of claim 8 wherein said first anneal is at a temperature of between about 650° C. and 710° C. for between about 20 and 60 seconds.

12. The method of claim 8 wherein said second anneal is at a temperature of between about 800° C. and 900° C. for between about 20 and 60 seconds.

13. The method of claim 8 wherein said etching away those parts of said titanium layer not changed to titanium silicide uses a 1:1:5 solution of $NH_4OH+H_2O_2+H_2O$.

14. The method of claim 8 wherein said etching away those parts of said titanium layer not changed to titanium silicide does not require a mask.

* * * * *